(12) United States Patent
Liao et al.

(10) Patent No.: US 8,802,524 B2
(45) Date of Patent: Aug. 12, 2014

(54) METHOD OF MANUFACTURING SEMICONDUCTOR DEVICE HAVING METAL GATES

(75) Inventors: Po-Jui Liao, Taichung (TW); Tsung-Lung Tsai, Tai-Nan (TW); Chien-Ting Lin, Hsinchu (TW); Shao-Hua Hsu, Taoyuan County (TW); Yi-Wei Chen, Taichung (TW); Hsin-Fu Huang, Tainan (TW); Tzung-Ying Lee, Ping-Tung County (TW); Min-Chuan Tsai, New Taipei (TW); Chan-Lon Yang, Taipei (TW); Chun-Yuan Wu, Yunlin County (TW); Teng-Chun Tsai, Tainan (TW); Guang-Yaw Hwang, Tainan (TW); Chia-Lin Hsu, Tainan (TW); Jie-Ning Yang, Ping-Tung County (TW); Cheng-Guo Chen, Changhua County (TW); Jung-Tsung Tseng, Tainan (TW); Zhi-Cheng Lee, Tainan (TW); Hung-Ling Shih, Chiayi County (TW); Po-Cheng Huang, Chiayi (TW); Yi-Wen Chen, Tainan (TW); Che-Hua Hsu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 245 days.

(21) Appl. No.: 13/053,223

(22) Filed: Mar. 22, 2011

(65) Prior Publication Data
US 2012/0244669 A1 Sep. 27, 2012

(51) Int. Cl.
*H01L 21/8238* (2006.01)
*H01L 29/66* (2006.01)
*H01L 29/78* (2006.01)

(52) U.S. Cl.
CPC ...... *H01L 21/823842* (2013.01); *H01L 21/823807* (2013.01); *H01L 29/6656* (2013.01); *H01L 29/66545* (2013.01); *H01L 29/7833* (2013.01)
USPC .................................. 438/212; 257/E21.635

(58) Field of Classification Search
CPC ............ H01L 21/28194; H01L 29/513; H01L 29/517; H01L 21/28202; H01L 29/518; H01L 21/28185; H01L 21/28238
USPC ......... 438/585, 275, 287, 591, 785, 216, 197, 438/104; 257/E21.309, E21.634, E21.444, 257/E21.62, E21.623, E21.633
See application file for complete search history.

(56) References Cited

U.S. PATENT DOCUMENTS

| 6,033,963 | A | 3/2000 | Huang |
| 6,162,694 | A | 12/2000 | Cheek |

(Continued)

*Primary Examiner* — Stephen W Smoot
*Assistant Examiner* — Edward Chin
(74) *Attorney, Agent, or Firm* — Winston Hsu; Scott Margo

(57) ABSTRACT

The present invention provides a method of manufacturing semiconductor device having metal gates. First, a substrate is provided. A first conductive type transistor having a first sacrifice gate and a second conductive type transistor having a second sacrifice gate are disposed on the substrate. The first sacrifice gate is removed to form a first trench. Then, a first metal layer is formed in the first trench. The second sacrifice gate is removed to form a second trench. Next, a second metal layer is formed in the first trench and the second trench. Lastly, a third metal layer is formed on the second metal layer wherein the third metal layer is filled into the first trench and the second trench.

20 Claims, 11 Drawing Sheets

(56) References Cited

U.S. PATENT DOCUMENTS

| | | |
|---|---|---|
| 6,171,910 B1 | 1/2001 | Hobbs |
| 6,406,956 B1 | 6/2002 | Tsai |
| 6,524,901 B1 | 2/2003 | Trivedi |
| 6,617,209 B1 | 9/2003 | Chau |
| 6,617,210 B1 | 9/2003 | Chau |
| 6,653,698 B2 | 11/2003 | Lee |
| 6,656,764 B1 | 12/2003 | Wang |
| 6,689,675 B1 | 2/2004 | Parker |
| 6,696,327 B1 | 2/2004 | Brask |
| 6,696,333 B1 | 2/2004 | Zheng |
| 6,709,911 B1 | 3/2004 | Doczy |
| 6,713,358 B1 | 3/2004 | Chau |
| 6,716,707 B1 | 4/2004 | Brask |
| 6,770,568 B2 | 8/2004 | Brask |
| 6,787,440 B2 | 9/2004 | Parker |
| 6,797,622 B2 | 9/2004 | Brask |
| 6,806,146 B1 | 10/2004 | Brask |
| 6,830,953 B1 | 12/2004 | Hu |
| 6,858,483 B2 | 2/2005 | Doczy |
| 6,867,102 B2 | 3/2005 | Brask |
| 6,879,009 B2 | 4/2005 | Zheng |
| 6,887,800 B1 | 5/2005 | Metz |
| 6,897,134 B2 | 5/2005 | Brask |
| 6,900,481 B2 | 5/2005 | Jin |
| 6,914,313 B2 | 7/2005 | Wang |
| 6,921,711 B2 * | 7/2005 | Cabral et al. .................. 438/589 |
| 6,939,815 B2 | 9/2005 | Brask |
| 6,949,769 B2 | 9/2005 | Hu |
| 6,953,719 B2 | 10/2005 | Doczy |
| 6,967,131 B2 | 11/2005 | Saenger |
| 6,972,225 B2 | 12/2005 | Doczy |
| 7,029,966 B2 | 4/2006 | Amos |
| 7,045,428 B2 | 5/2006 | Brask |
| 7,056,794 B2 | 6/2006 | Ku |
| 7,064,050 B2 | 6/2006 | Cabral, Jr. |
| 7,064,066 B1 | 6/2006 | Metz |
| 7,112,851 B2 | 9/2006 | Saenger |
| 7,126,199 B2 | 10/2006 | Doczy |
| 7,138,323 B2 | 11/2006 | Kavalieros |
| 7,144,783 B2 | 12/2006 | Datta |
| 7,148,099 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,160,767 B2 | 1/2007 | Brask |
| 7,163,853 B2 | 1/2007 | Tu |
| 7,166,505 B2 | 1/2007 | Chau |
| 7,176,090 B2 | 2/2007 | Brask |
| 7,176,537 B2 | 2/2007 | Lee |
| 7,183,184 B2 | 2/2007 | Doczy |
| 7,192,890 B2 | 3/2007 | Zhou |
| 7,196,856 B2 | 3/2007 | Nakamura |
| 7,208,361 B2 | 4/2007 | Shah |
| 7,217,611 B2 | 5/2007 | Kavalieros |
| 7,220,365 B2 | 5/2007 | Qu |
| 7,271,045 B2 | 9/2007 | Prince |
| 7,271,083 B2 | 9/2007 | Tu |
| 7,285,829 B2 | 10/2007 | Doyle |
| 7,316,949 B2 | 1/2008 | Doczy |
| 7,317,231 B2 | 1/2008 | Metz |
| 7,326,610 B2 | 2/2008 | Amos |
| 7,332,439 B2 | 2/2008 | Lindert |
| 7,355,281 B2 | 4/2008 | Brask |
| 7,365,015 B2 | 4/2008 | Lin |
| 7,381,608 B2 | 6/2008 | Brask |
| 7,384,880 B2 | 6/2008 | Brask |
| 7,387,927 B2 | 6/2008 | Turkot, Jr. |
| 7,390,709 B2 | 6/2008 | Doczy |
| 7,393,766 B2 | 7/2008 | Wang |
| 7,422,936 B2 | 9/2008 | Barns |
| 7,425,490 B2 | 9/2008 | Kavalieros |
| 7,439,113 B2 | 10/2008 | Doczy |
| 7,531,404 B2 | 5/2009 | Pae |
| 7,569,443 B2 | 8/2009 | Kavalieros |
| 7,595,248 B2 | 9/2009 | Hattendorf |
| 8,574,990 B2 * | 11/2013 | Liao et al. ..................... 438/275 |
| 2005/0048722 A1 * | 3/2005 | Saito et al. .................... 438/275 |
| 2006/0008954 A1 | 1/2006 | Kavalieros |
| 2007/0029627 A1 | 2/2007 | Datta |
| 2007/0037372 A1 * | 2/2007 | Kavalieros et al. ........... 438/585 |
| 2007/0040227 A1 | 2/2007 | Datta |
| 2007/0141798 A1 | 6/2007 | Bohr |
| 2007/0262451 A1 | 11/2007 | Rachmady |
| 2009/0039433 A1 | 2/2009 | Yang |
| 2009/0087974 A1 | 4/2009 | Waite |
| 2010/0044783 A1 | 2/2010 | Chuang |
| 2010/0052066 A1 | 3/2010 | Yu |
| 2010/0065926 A1 | 3/2010 | Yeh |
| 2010/0068877 A1 * | 3/2010 | Yeh et al. ...................... 438/592 |
| 2010/0127336 A1 * | 5/2010 | Chambers et al. ............ 257/369 |
| 2011/0018072 A1 * | 1/2011 | Lin et al. ....................... 257/410 |
| 2012/0256276 A1 * | 10/2012 | Hwang et al. ................. 257/410 |

* cited by examiner

METHOD OF MANUFACTURING SEMICONDUCTOR DEVICE HAVING METAL GATES

BACKGROUND OF THE INVENTION

1. Field of the Invention

The present invention relates to a method of manufacturing a semiconductor device having metal gates.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-K gate dielectric layer.

In a complementary metal-oxide semiconductor (CMOS) device, one of the dual work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first processes and gate last processes. In a conventional dual metal gate method applied with the gate first process, the anneal process for forming the source/drain ultra-shallow junction, and the silicide process are performed after forming the metal gate. After performing the anneal process having such strict heat budget, it is found that a flat band voltage (Vfb) does not increase or decrease linearly with decreasing EOT of the high-K gate dielectric layer. Instead, a roll-off issue is observed. Therefore, the gate last process is developed to improve the Vfb roll-off issue and avoid generating leakage current due to re-crystallization of the high-K gate dielectric layer occurring in high-temperature processes, and to widen material choices for the high-K gate dielectric layer and the metal gate in the gate first process.

In the conventional gate last process, a sacrifice gate or a replacement gate is provided and followed by performing processes used to construct a normal MOS transistor. Then, the sacrifice/replacement gate is removed to form a gate trench. Consequently, the gate trench is filled with metals according to the different electrical requirements. However, because of the complicated steps of the gate last processes, the manufacturers are devoted to simplifying the manufacturing process.

SUMMARY OF THE INVENTION

The present invention therefore provides a method of manufacturing a semiconductor device with better reliability.

According to one embodiment of the present invention, a method of manufacturing semiconductor device having metal gates is provided. First, a substrate is provided. A first conductive type transistor having a first sacrifice gate and a second conductive type transistor having a second sacrifice gate are disposed on the substrate. The first sacrifice gate is removed to form a first trench. Then, a first metal layer is formed in the first trench. The second sacrifice gate is removed to form a second trench. Next, a second metal layer is formed in the first trench and the second trench. Lastly, a third metal layer is formed on the second metal layer wherein the third metal layer is filled into the first trench and the second trench.

The method includes forming the P type work function metal layer or the N type work function metal layer respectively in the first trench or the second trench, which is then filled with the metal layer. Thus, the present invention can prevent the bad metal layer (usually Al) filling issue. Moreover, only one CMP process is needed in the present invention, so the yield of the method can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
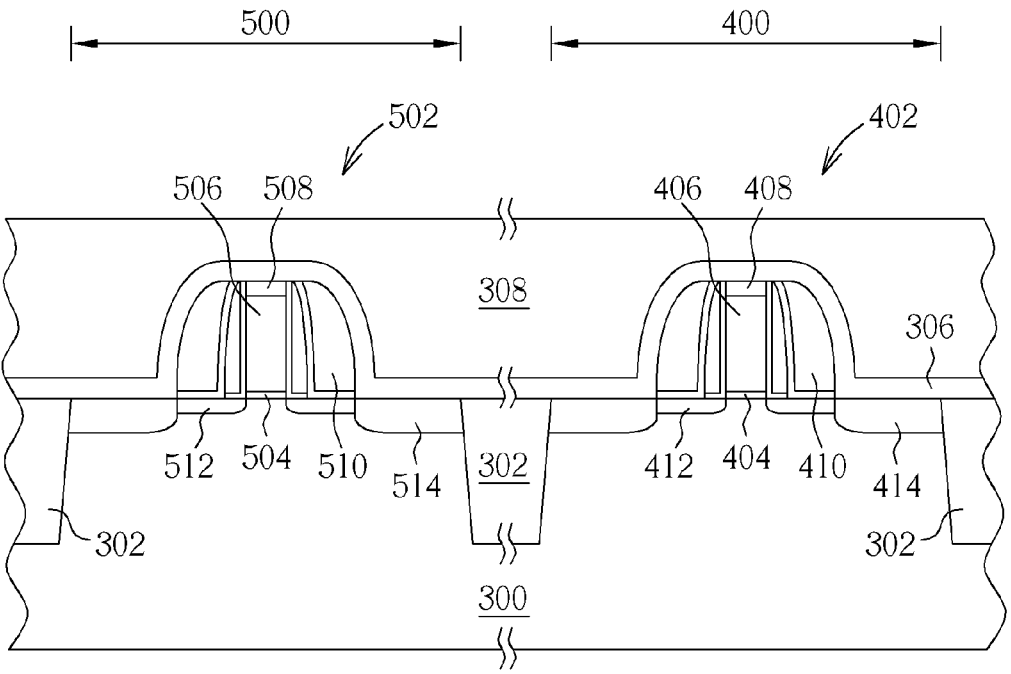
FIG. 1 to FIG. 12 illustrate schematic diagrams of the method of manufacturing the semiconductor device having metal gates according to the first embodiment of the present invention.

To provide a better understanding of the presented invention, preferred embodiments will be made in detail. The preferred embodiments of the present invention are illustrated in the accompanying drawings with numbered elements.

Please refer to FIG. 1 to FIG. 12, illustrating schematic diagrams of the method of manufacturing the semiconductor device having metal gates according to the first embodiment of the present invention. First, a substrate 300 is provided, such as a silicon substrate, a silicon-containing substrate or a silicon-on-insulator (SOI) substrate. A plurality of shallow trench isolations (STI) 302 are disposed on the substrate 300. In one embodiment, the STI 302 can provide a stress. According to the areas encompassed by the STI 302, a first active region 400 and a second active region 500, which are insulated from each other, are defined on the substrate 300. Then, a first conductive type transistor 402 and a second conductive type transistor 502 are formed on the substrate 300 respectively in the first active region 400 and the second active region 500. In one preferred embodiment of the present invention, the first conductive type transistor 402 is a P-type transistor, while the second conductive type transistor 502 is an N-type transistor.

As shown in FIG. 1, the first conductive type transistor 402 includes a first gate dielectric layer 404, a first sacrifice gate 406, a first capping layer 408, a first spacer 410, a first light doped drain (LDD) 412 and a first source/drain 414. In one preferred embodiment of the present invention, the first gate dielectric layer 404 can be a $SiO_2$ layer or a high-K gate dielectric layer. The high-k gate dielectric layer includes silicon nitride (SiN), silicon oxynitride (SiON) and metal oxide. And the metal oxide comprises rare earth metal oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first gate dielectric layer 404 may be single layer or a multi layer and preferably includes a $SiO_2$ layer and a high-k dielectric layer from bottom to top in series. The first sacrifice gate 406 is a poly-silicon gate. In another embodiment, the first sacrifice gate 406 is a multi-layered gate including a poly-silicon layer, an amorphous silicon layer or a germanium layer. In another embodiment, the sacrifice gate 406 may include an inclined sidewall, thereby forming an "up-large-bottom-small" structure. A barrier layer or an etch stop layer can be optionally formed between the first gate dielectric layer 404 and the first sacrifice gate 406, for instance, a SiN layer or a metal nitride layer such as TiN or TaN. The first capping layer 408 is an optional layer including SiN layer, $SiO_2$ or their combination for example. The first spacer 410 can be a multilayered structure including high temperature oxide (HTO), SiN, SiO or SiN formed by hexachlorodisilane ($Si_2Cl_6$) (HCD-SiN). In one embodiment, the first spacer 410 can be partially or completely removed to produce a desired stress of the contact etch stop layer (CESL) 306 toward the first conductive type transistor 402 and the second conductive type transistor 502. The first LDD 412 and the first source/drain 414 are formed by appropriate implant doping.

The second conductive type transistor 502 includes a second gate dielectric layer 504, a second sacrifice gate 506, a second capping layer 508, a second spacer 510, a second LDD 512 and a second source/drain 514. The embodiment of each component in the second conductive type transistor 502 is similar to that of the first conductive type transistor 402 and is not described repeatedly. In addition, the first conductive type transistor 402 and the second conductive type transistor 502 can further include other semiconductor structures which are not explicitly shown in FIG. 1, such as a silicide layer, a source/drain having an hexagon (also called sigma Σ) or octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to form a selective strain scheme (SSS) wherein a compressing force is applied on the first conductive type electrode 402 and a straining force is applied on the second conductive type electrode 502.

Figure 2:
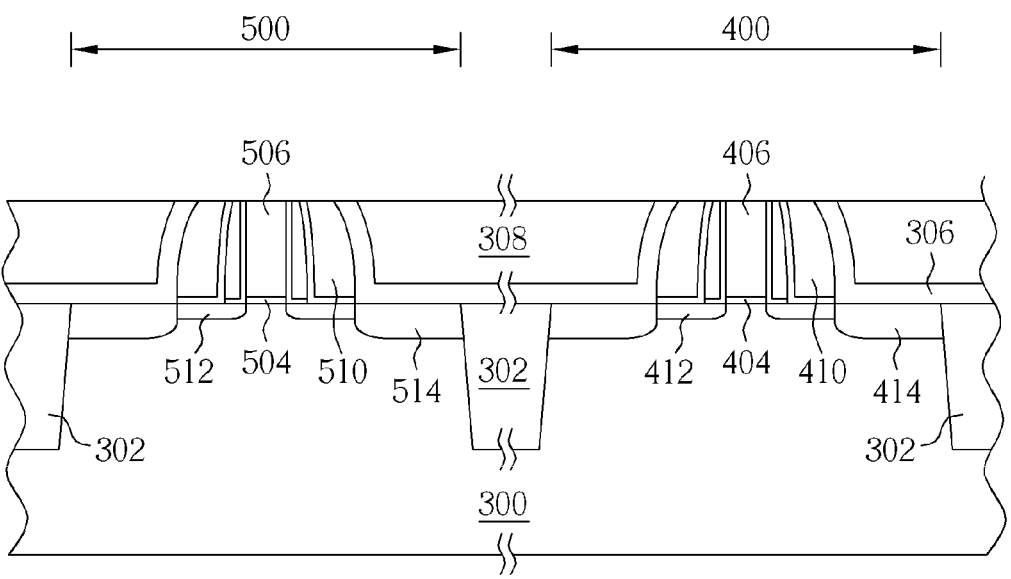

As shown in FIG. 2, a planarization process, such as a chemical mechanical polish (CMP) process or an etching-back process or their combination is performed to remove a part of the ILD layer 308, a part of the CESL 306, a part of the first spacer 410, a part of the second spacer 510, and completely remove the first capping layer 408 and the second capping layer 508, until the top surface of the first sacrifice gate 406 and the second sacrifice gate 506 are exposed.

Figure 3:
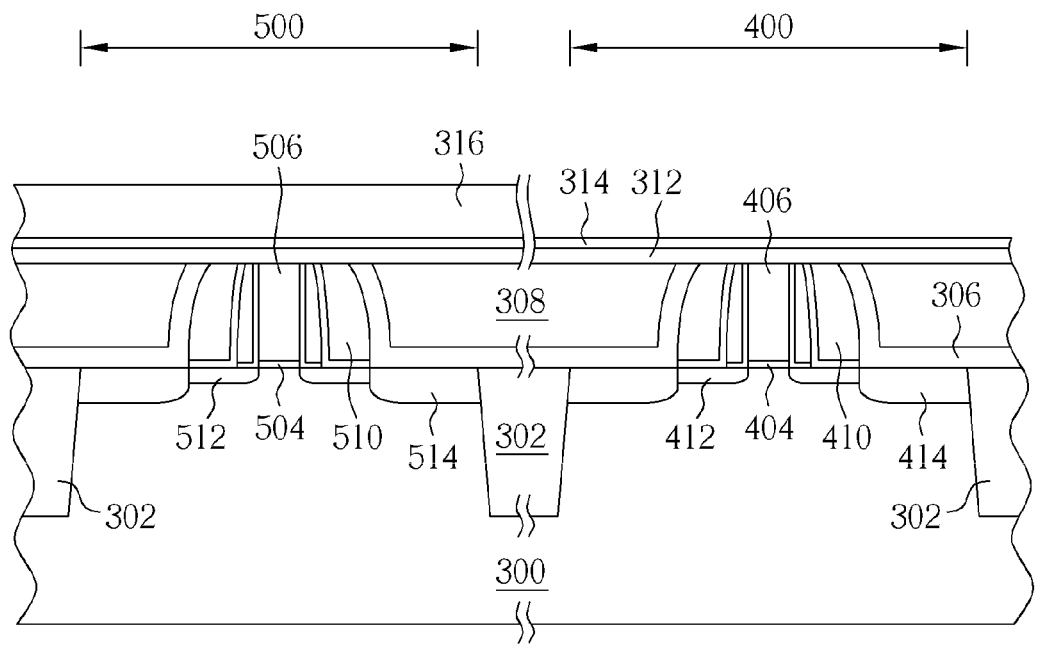

As shown in FIG. 3, a mask layer 312 and an optional auxiliary layer 314 are formed on the substrate 300. In one preferred embodiment of the present invention, the mask layer 312 is a TiN layer, and the auxiliary layer 314 is a $SiO_2$ layer. The auxiliary layer 314 can provide a better adhesion force toward the first patterned photoresist layer 316 which is formed in the follow-up step. In one embodiment, the thickness of the mask layer 312 is about 50~150 A (angstrom), preferably 100 A, and the thickness of the auxiliary layer 314 is about 0~50 A, preferably 20 A. However, the thickness is not limited thereto. Then, a first patterned photoresist layer 316 is formed on the substrate 300 to cover at least the second active region 500.

Figure 6:
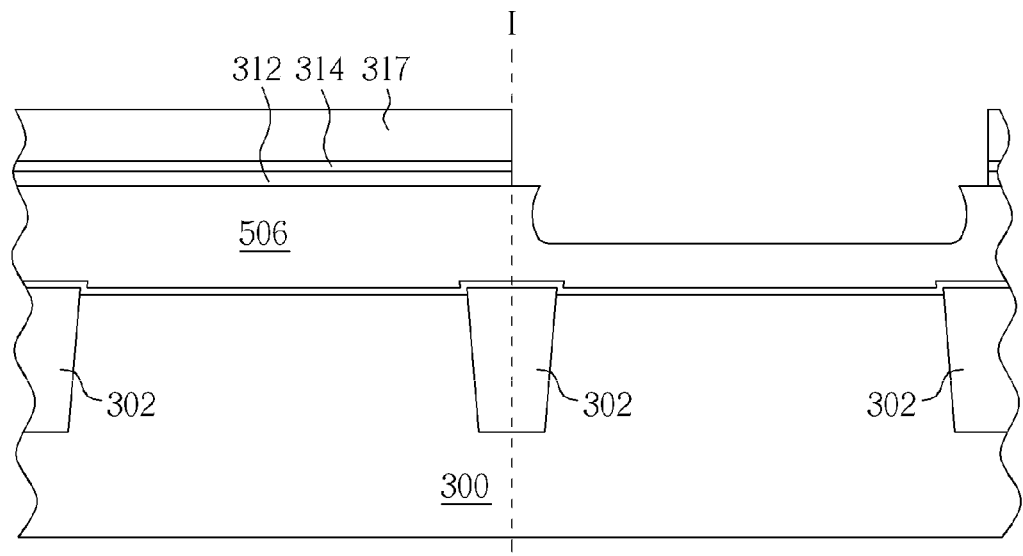
Figure 7A:
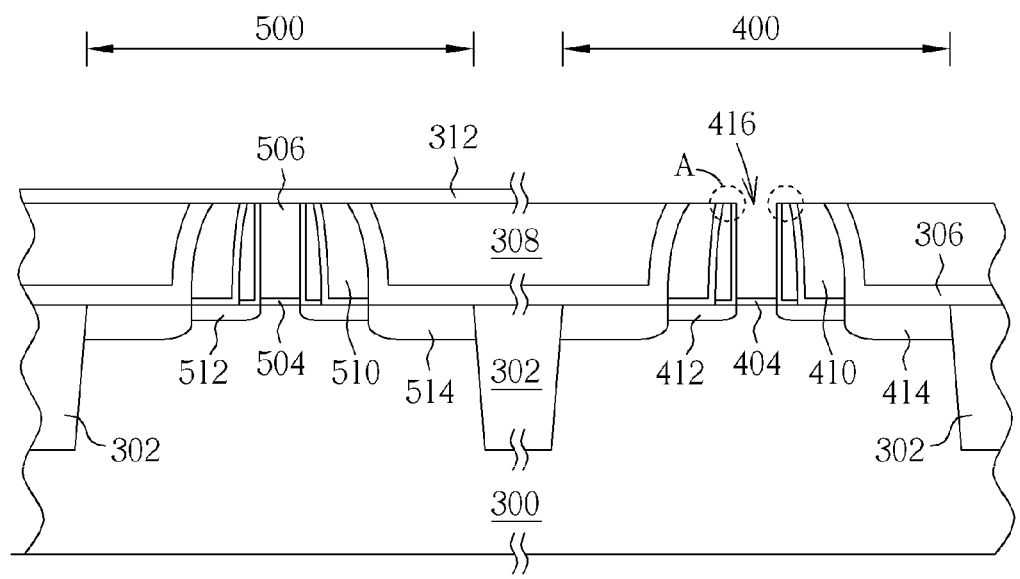
Figure 7B:
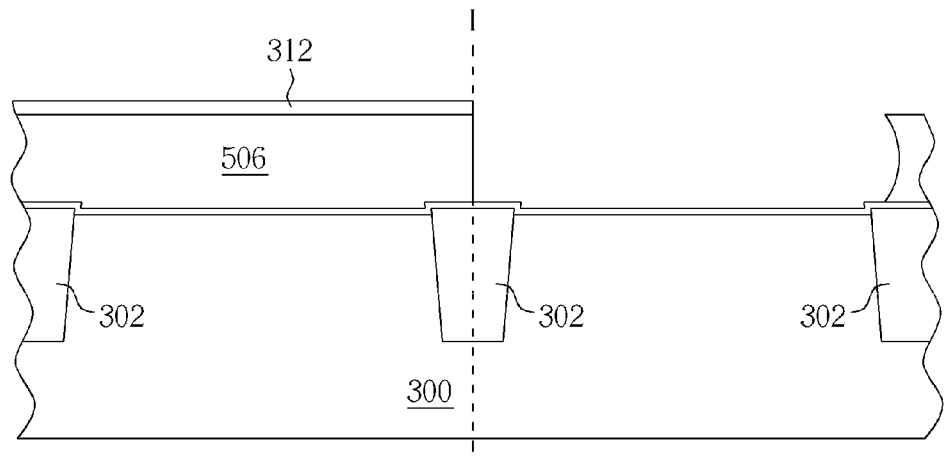

Subsequently, by using the first patterned photoresist layer 316 as a mask, a portion of the mask layer 312, the auxiliary layer 314 and the first sacrifice gate 406 not covered by the first patterned photoresist layer 316 are removed away. The above steps are accomplished by patterning the mask layer 312 and then using the patterned mask layer 312 as a mask to remove the first sacrifice gate 406. However, as the material used for the first sacrifice gate 406 typically includes poly-silicon, although the wet etching process having a better etching selectivity can stop on the first gate dielectric layer 404, the under-cut phenomenon easily occurs when using the mask layer 312 as a mask to remove the below poly-silicon. Such problem is more likely to occur in forming other semiconductor structures, such as a SRAM with a poly-silicon interface between the gate of PMOS and the gate of the NMOS. On the contrary, the dry etching step can avoid under-cut phenomenon but can not stop on the first gate dielectric layer 404, leading to the over-etching problem. Therefore, one embodiment of the present invention is to perform a dry etching process first to remove the large part of the first sacrifice gate 406 and then to perform a wet etching process to thoroughly remove the first sacrifice gate 406 and stop on the first gate dielectric layer 404. In another embodiment, please refer to FIG. 4a to FIG. 7b, wherein FIG. 4b and FIG. 7b show a semiconductor structure having a poly-silicon gate interface between PMOS and NMOS. FIG. 4b and FIG. 7b represent the cross-sectional view of FIG. 4a and FIG. 7a, respectively, and the cross line corresponds to the second sacrifice gate 506. The dashed line I in FIG. 4b and FIG. 7b represents the position of the poly-silicon gate interface. The right part of the dashed line I represents a P-type transistor while the left part of the dashed line I represents an N-type transistor.

Figure 4A:
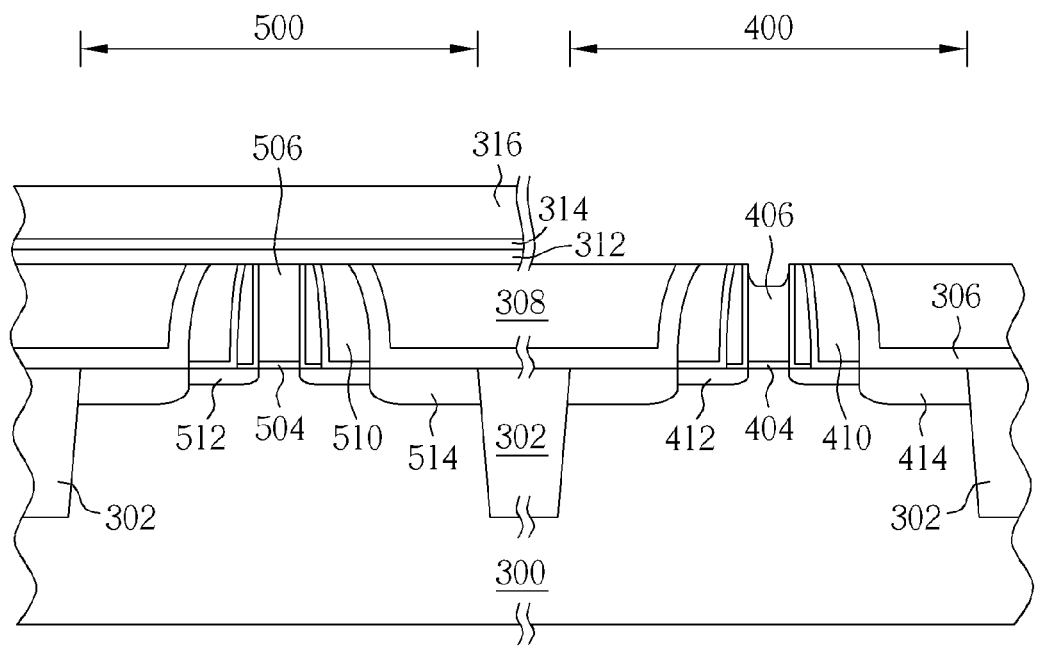
Figure 4B:
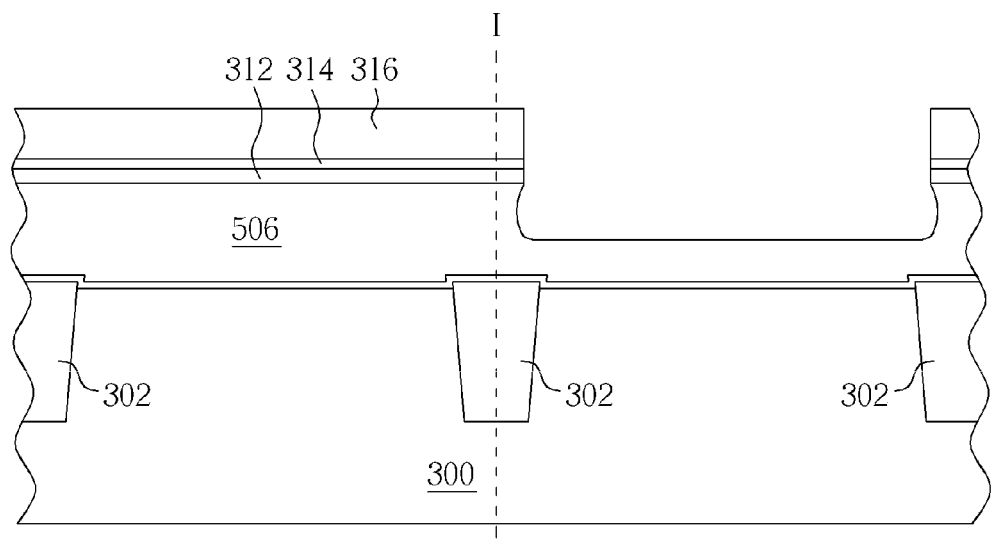
Figure 5:
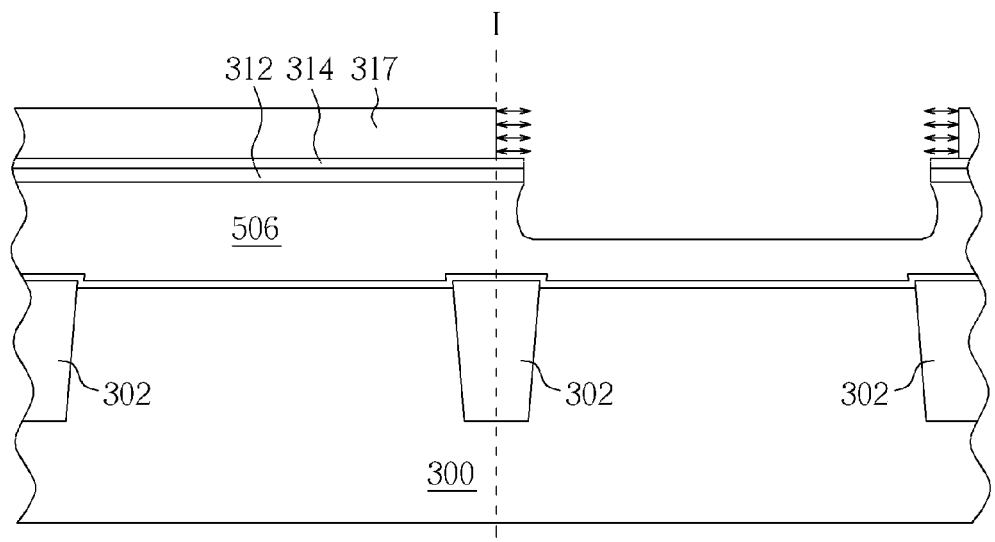

As shown in FIG. 4a and FIG. 4b, a dry etching step is performed to remove the mask layer 316, the auxiliary layer 312 and a part of the first sacrifice gate 406 not covered by the first patterned photoresist layer 316. Next, as shown in FIG. 5, a trimmed process is performed toward the first patterned photoresist layer 316. For example, by using $O_2$, $O_3$, $CF_4$, HBr or other plasma gas, the sidewall of the first patterned photoresist layer 316 is trimmed, and the width of the first patterned photoresist layer 316 is slightly reduced. The first patterned photoresist layer 316 evenly shrinks inwardly to form a second patterned photoresist layer 317. As shown in FIG. 4b, the sidewall of the first patterned photoresist layer 316 is originally near the first sacrifice gate 416, and after the photoresist trimming process, the first patterned photoresist layer 316 shrinks back toward the second sacrifice gate 516, thereby forming the second patterned photoresist layer 317. It is understood that, from a top view of the embodiment, the covering area of the second patterned photoresist layer 317 is smaller than that of the first patterned photoresist layer 316. Subsequently, as shown in FIG. 6, by using the second patterned photoresist layer 317 as a mask, the mask layer 312 and the auxiliary layer 314 not covered by the second patterned photoresist layer 317 are removed. Lastly, as shown in FIG. 7a and FIG. 7b, after removing the second patterned photoresist layer 317 and the auxiliary layer 314, a wet etch is performed to completely remove the first sacrifice gate 406. As shown in FIG. 7a, a first trench 416 is formed in the first conductive type transistor 402. The second sacrifice gate 506 of the second conductive type transistor 502 is not removed away since it is covered by the mask layer 312. As shown in FIG. 7b, the poly-silicon sidewall is formed accurately near the dashed line I.

In one embodiment of the present invention, after removing the first sacrifice gate 406, an annealing step can be performed. As a part of the CESL 306 is removed by the planarization process as shown in FIG. 2, the stress originally generated by the CESL 306 would be leveled down. Therefore, an annealing process can be performed after removing the first sacrifice gate 406 in order to restore the stress generated by the CESL 306. In one preferred embodiment, the annealing process is performed by treating with heat under about 500° C. to 700° C. in a rapid thermal annealing (RTA) equipment or a laser annealing system, or by treating with UV light under about 300° C. to 450° C. Besides, after removing the first sacrifice gate 406, a dry etch step or a wet etch step or their combination can be performed to remove the upper part of the first spacer 410 by forming a photoresist covering the lower part of the first trench 416. For example, the first spacer 410 near region A can be removed, so as to enlarge the upper opening of the first trench 416.

Figure 8:
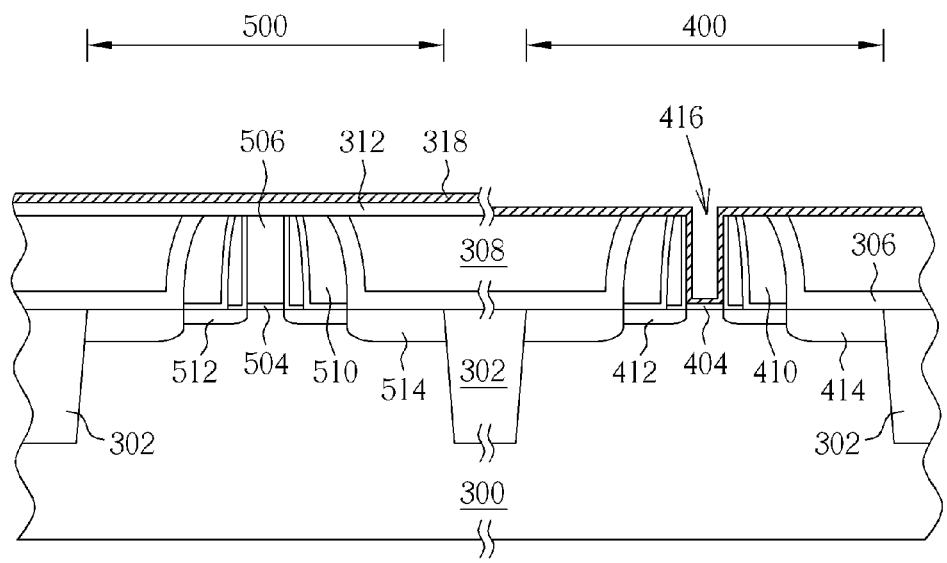

Next, as shown in FIG. 8, a P type work function metal layer 318 is formed on the substrate 300. The P type work function metal layer 318 is formed conformally on the surface of the first trench 416 where the first trench 416 is not completely filled with the P type work function metal layer 318. In the present embodiment, the P type work function metal layer 318 serves as a work function metal required by a P-type transistor including Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. The P type work function metal layer 318 can include the same material or different material as the mask layer 312. In one embodiment, the P type work function metal layer 318 includes the material having etching selectivity substantially close to that of the mask layer 312. Preferably, the P type work function metal layer 318 includes the same material as is used in the mask layer 312.

Figure 9:
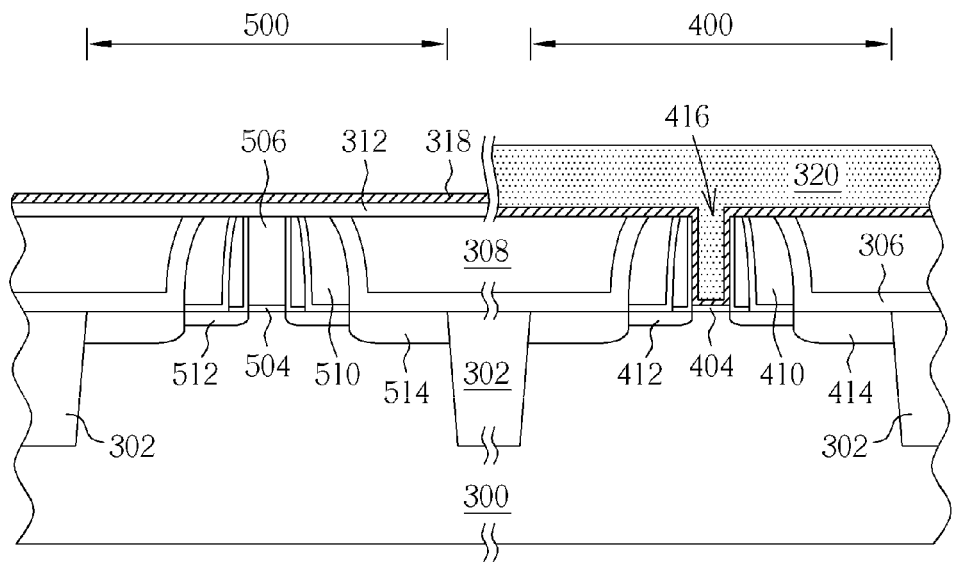
Figure 10:
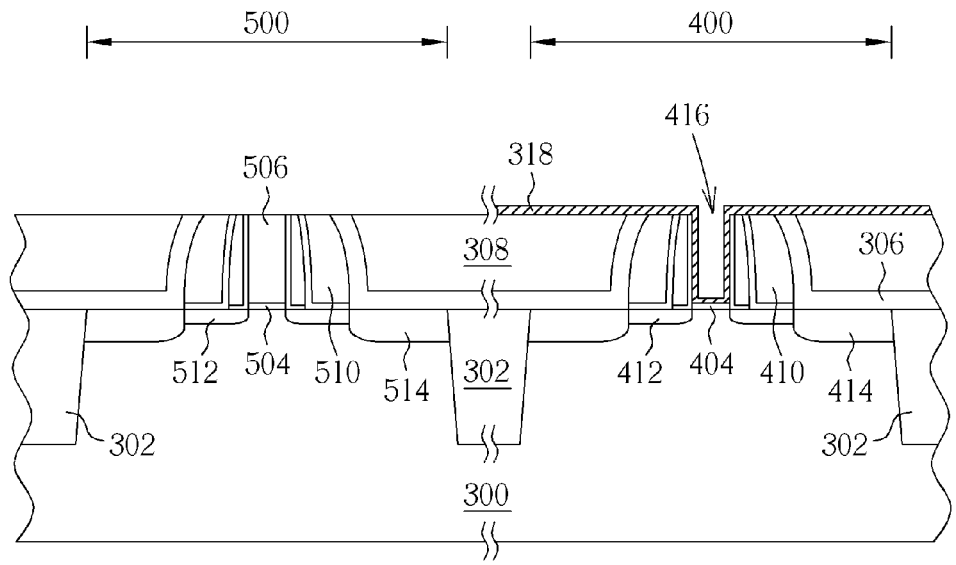

As shown in FIG. 9, a third patterned photoresist layer 320 is formed on the substrate 300 to cover at least the first active region 400. As shown in FIG. 10, by using the third patterned photoresist layer 32o as a mask, a part of the P type work function metal layer 318 and the mask layer 312 which are not covered by the third patterned photoresist layer 32o are removed, thereby exposing the second sacrifice gate 506. Next, the third patterned photoresist layer 32o is removed. It is understood that step of using the third patterned photoresist layer 32o as a mask may include the trimming step described above.

Figure 11:
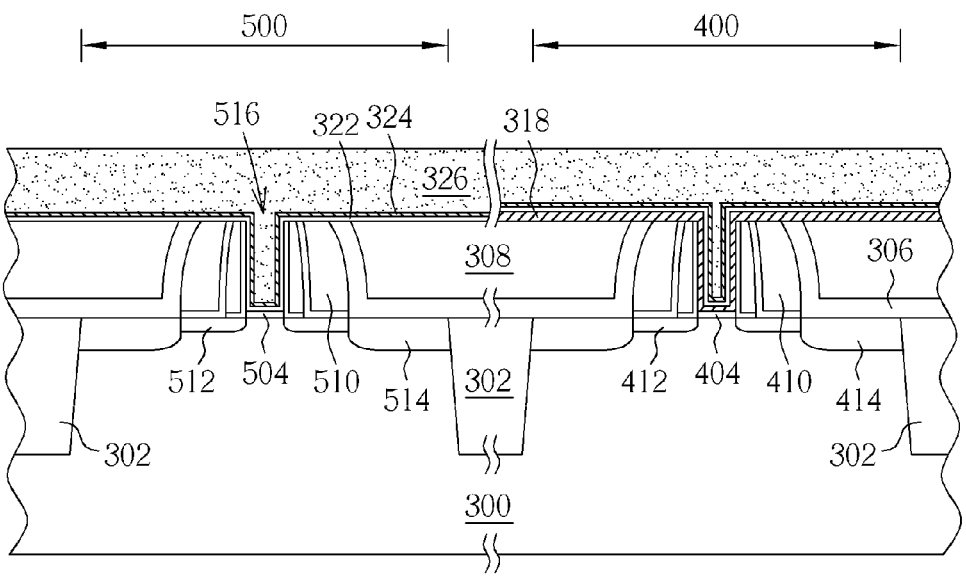

As shown in FIG. 11, the second sacrifice gate 506 is removed by using a dry etching process and/or a wet etching process, thereby forming a second trench 516 in the second conductive type transistor 502. Similarly, an annealing process can be performed to restore the stress generated by the CESL 306. After removing the second sacrifice gate 506, a dry etch step or a wet etch step or their combination can be performed to remove the upper part of the second spacer 510 by forming a photoresist covering the lower part of the second trench 516, so as to enlarge the upper opening of the second trench 516. Subsequently, an N type work function metal layer 322 is formed on the substrate 300. The N type work function metal layer 322 is formed conformally on the surface of the second trench 516 and on the surface of the P type work function metal layer 318 in the first trench 416. However, the first trench 416 and the second trench 516 are not completely filled with the N type work function metal layer 322. In one preferred embodiment of the present invention, the second metal layer 324 serves as a work function metal required by an N-type transistor including titanium aluminides (TiAl), aluminum zirconium (ZrAl), aluminum tungsten (WAl), aluminum tantalum (TaAl) or aluminum hafnium (HfAl), but should not be limited thereto. Next, in order to prevent the N type work function metal layer 322 from being spiked by the metal layer 326 in the following step, a barrier layer 324 can be formed optionally between the N type work function metal layer 322 and the metal layer 326. In one preferred embodiment, the barrier layer 324 includes metal such as TiN. Lastly, a low resistive metal layer 326 is formed on the substrate 300. The metal layer 326 is formed on the N type work function metal layer 322 (if the barrier layer 324 is utilized, the metal layer 326 is formed on the barrier layer 324) and completely fills the first trench 416 and the second trench 516.

Figure 12:
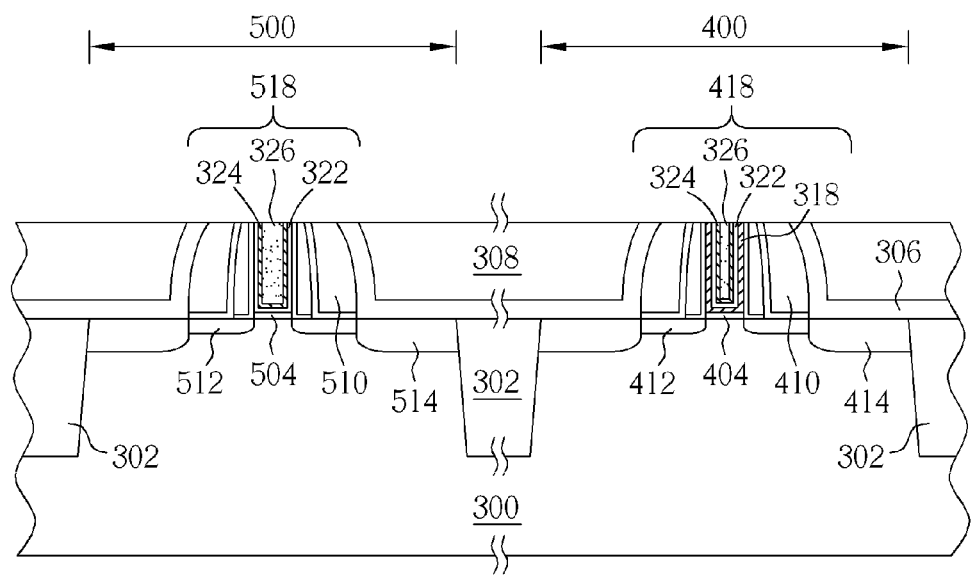

Lastly, as shown in FIG. 12, a planarization process is performed to simultaneously remove the P type work function metal layer 318, the N type work function metal layer 322, (the barrier layer 324) and the metal layer 326 outside the first trench 416 and the second trench 516. Thus, the P type work function metal layer 318, the N type work function metal layer 322, (the barrier layer 324) and the metal layer 326 in the first trench 416 together form a first metal gate 418 of the first conductive type transistor 402 (P-type transistor), which has a work function substantially between 4.8 eV and 5.2 eV. The N type work function metal layer 322, (the barrier layer 324) and the metal layer 326 in the second trench 516 together form a second metal gate 518 of the second conductive type transistor 502 (N-type transistor) which has a work function substantially between 3.9 eV and 4.3 eV.

After finishing the first metal gate 418 and the second metal gate 518, a contact plug forming process can be carried out, for example, a contact plug having a stress can be formed. In another embodiment, before forming the contact plug, the ILD layer 306 and the CESL 308 can be removed completely. Then, at least one CESL (not shown) can be formed on the substrate 300. By applying a UV or a heat energy, the new CESL can generate a stress, thereby enhancing the efficiency of the first conductive type transistor 402 and the second conductive type transistor 502, respectively. Another ILD layer (not shown) is then formed and at least a contact plug having appropriate stress can be formed therein.

Figure 13:
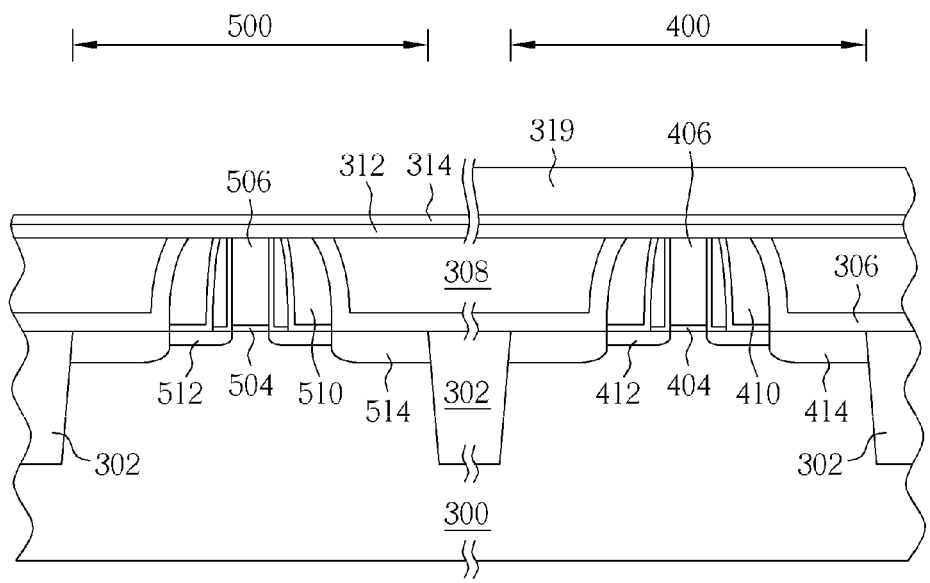
FIG. 13 to FIG. 19 illustrate schematic diagrams of the method of manufacturing the semiconductor device having metal gates according to the second embodiment of the present invention.

It should be noted that the above methods present forming the high-k gate dielectric layer at first (namely, the high-K first process). However, those skilled in the art can realize that, in the present invention, it is also available to form the high-k gate dielectric layer after removing the sacrifice gate (namely, the high-K last process). For example, a high-K gate dielectric layer can be formed on the surface of the first trench 416 before forming the P type work function metal layer 318. Subsequently, the P type work function metal layer 318 and the metal layer 326 are formed on the high-K gate dielectric layer in the first trench 416. In this embodiment, the high-K gate dielectric layer and the P type work function metal layer 318 will form a U shape in their cross section. In another embodiment, it is also available to form a high-K gate dielectric layer on the surface of the second trench 516 before forming the N type work function metal layer 322. Then, the N type work function metal layer 322 and the metal layer 326 are formed on the high-K gate dielectric layer in the second trench 516. In this embodiment, the high-K gate dielectric layer and the N type work function metal layer 322 will form a U shape in their cross section. In addition, when the invention is performed in the high-k last process, the material of the dielectric layer formed under the sacrifice gate is not limited to high-k material but can include another dielectric material such as $SiO_2$. Please refer to FIG. 13 to FIG. 19, illustrating schematic diagrams of the method of manufacturing the semiconductor device having metal gates according to the second embodiment of the present invention. The former steps of the second embodiment are similar to those in FIG. 1 to FIG. 2 of the first embodiment and repeated descriptions are omitted. As shown in FIG. 13, a mask layer 312, an auxiliary layer 314 and a first patterned photoresist layer 319 are formed on the substrate 300. The first patterned photoresist layer 319 at least covers the first active region 400.

Figure 14:
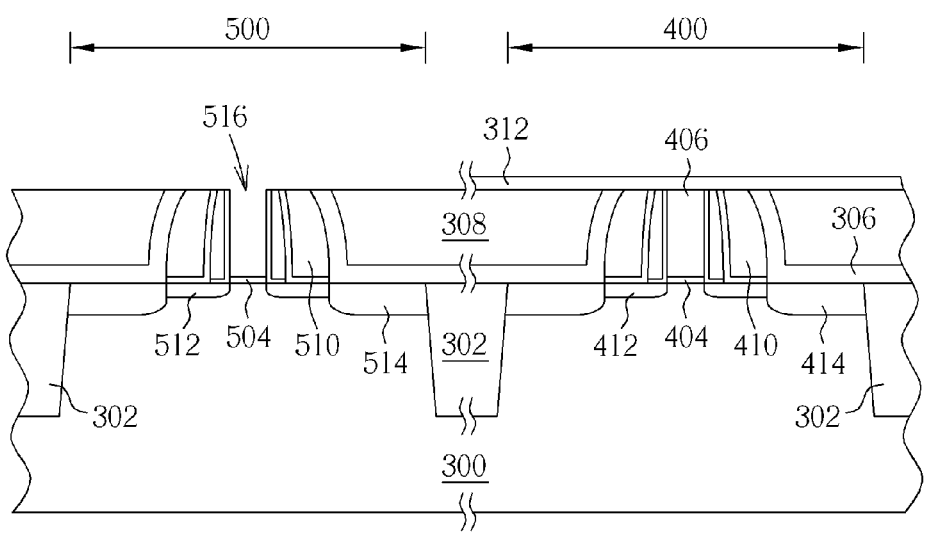

As shown in FIG. 14, by using the first patterned photoresist layer 319 as a mask, a portion of the mask layer 312, the auxiliary layer 314 and the second sacrifice gate 506 not covered by the first patterned photoresist layer 319 are removed away. Then, the first patterned photoresist layer 319 and the auxiliary layer 314 are removed. The second sacrifice gate 506 is completely removed to form a second trench 516. An annealing step is performed to restore the stress of the CESL 308. It is understood that step of using the first patterned photoresist layer 319 as a mask may include the trimming step described in the first embodiment. Or, a dry etch step or a wet etch step or their combination can be performed to enlarge the upper opening of the second trench 516.

Figure 15:
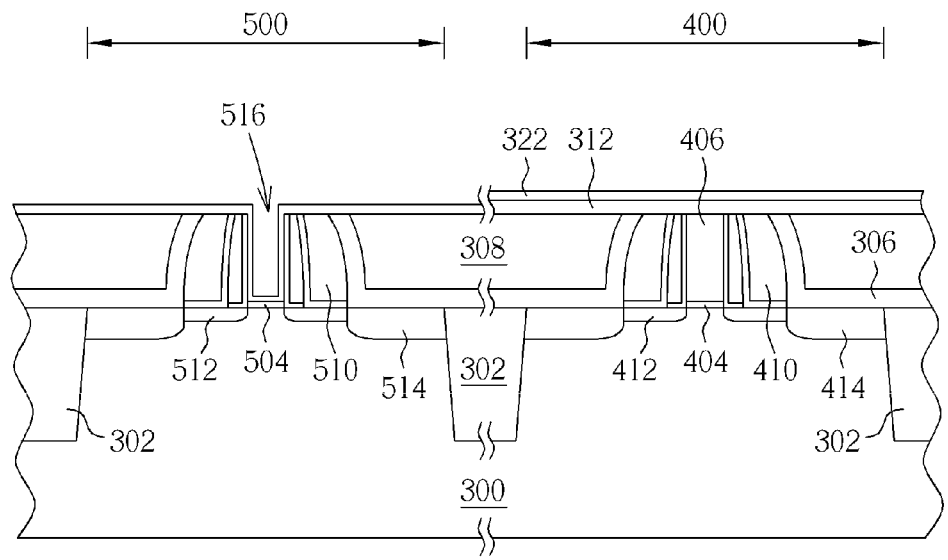
Figure 16:
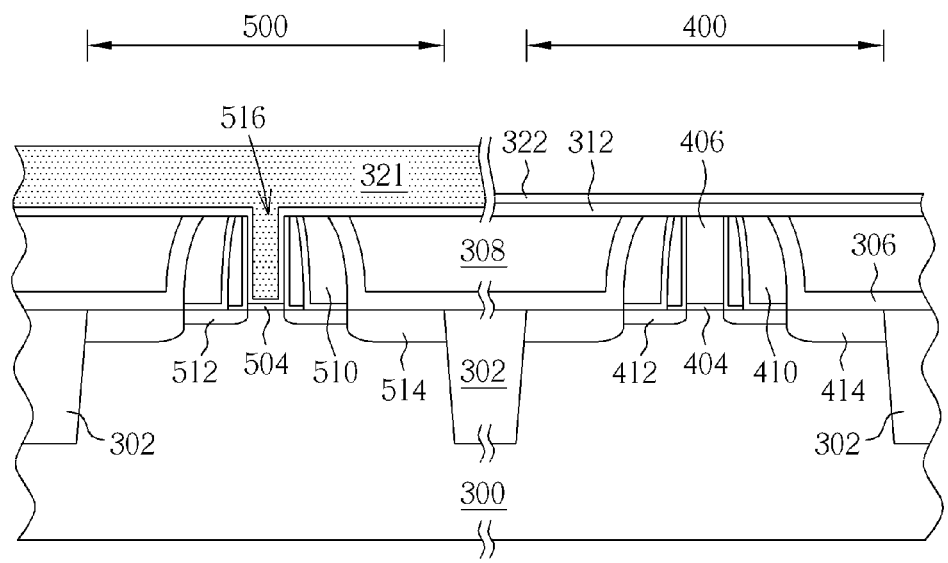
Figure 17:
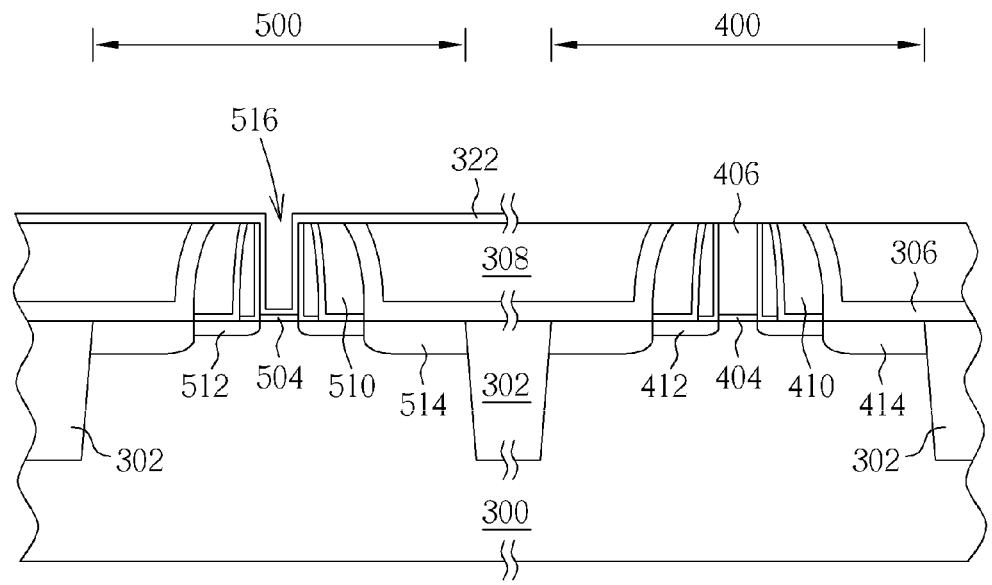

As shown in FIG. 15, an N type work function metal layer 322 is formed on the substrate 300. The N type work function metal layer 322 is formed on the surface of the second trench 516, where the second trench 516 is not completely filled with the N type work function metal layer 322. Next, as shown in FIG. 16, a third patterned photoresist layer 321 is formed on the substrate 300 to cover at least the second active region 500. Then, as shown in FIG. 17, by using the third patterned photoresist layer 321 as a mask, a part of the N type work function metal layer 322 and the mask layer 312 which are not covered by the third patterned photoresist layer 321 are removed, thereby exposing the first sacrifice gate 406. Then, the third patterned photoresist layer 321 is removed. It is understood that step of using the third patterned photoresist layer 321 as a mask may include the trimming step described in the first embodiment.

Figure 18:
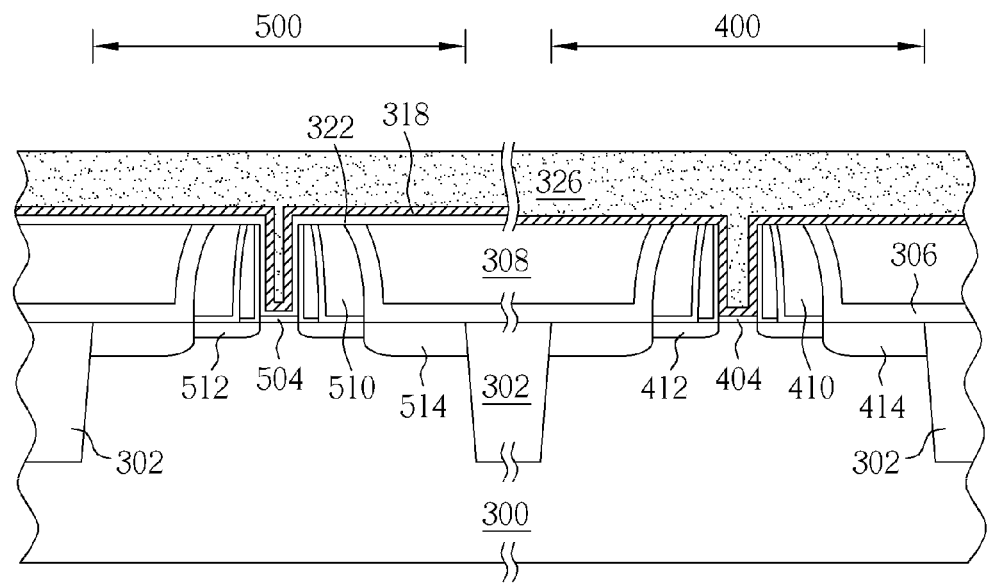
Figure 19:
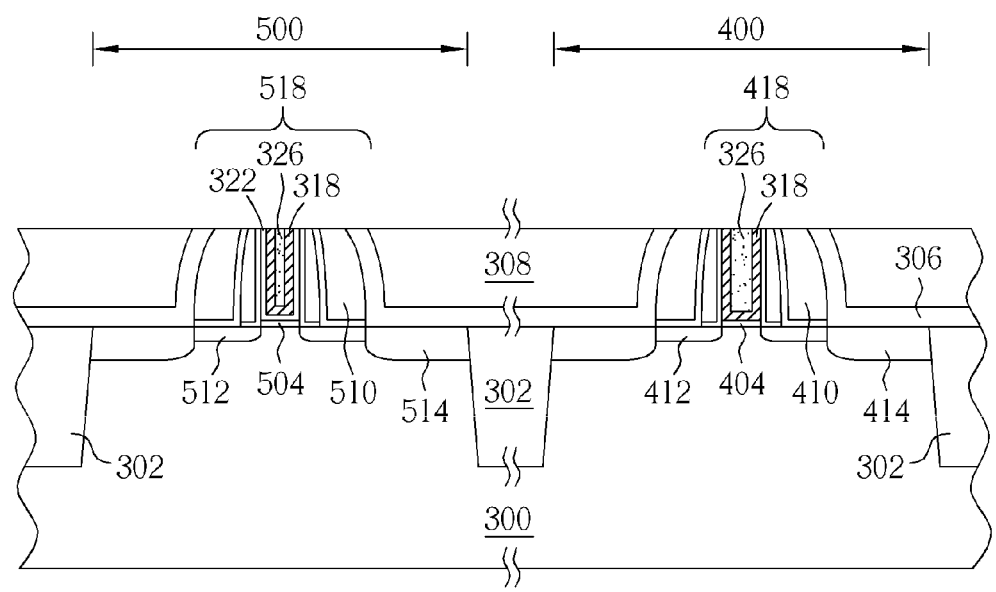

As shown in FIG. 18, the first sacrifice gate 406 is removed by using a dry etching process and/or a wet etching process, thereby forming a first trench 416 in the first conductive type transistor 402. An annealing process can be carried out to restore the stress generated by the CESL 306. Or, a dry etch step or a wet etch step or their combination can be performed to enlarge the upper opening of the first trench 416. Subsequently, a P type work function metal layer 318 is formed on the substrate 300. The P type work function metal layer 318 is formed on the surface of the first trench 416 and on the surface of the N type work function metal layer 322 in the second trench 516. However, the first trench 416 and the second trench 516 are not completely filled with the P type work function metal layer 322. Next, a low resistive metal layer 326 can be formed directly on the P type work function metal layer 322 and completely fills the first trench 416 and the second trench 516.

Lastly, a planarization process is performed to remove the P type work function metal layer 318, the N type work function metal layer 322 and the metal layer 326 outside the first trench 416 and the second trench 516. Thus, the P type work function metal layer 318 and the metal layer 326 in the first trench 416 together form a first metal gate 418 of the first conductive type transistor 402 (P-type transistor), which has a work function substantially between 4.8 eV and 5.2 eV. The N type work function metal layer 322, the P type work function metal layer 318 and the metal layer 326 in the second trench 516 together form a second metal gate 518 of the second conductive type transistor 502 (N-type transistor) which has a work function substantially between 3.9 eV and 4.3 eV.

It is one salient feature in the second embodiment that, as the P type work function metal layer 318 can also serve a good material for barrier (TiN), comparing with the first embodiment, there is no need to further form a barrier layer between the N type work function metal layer 322 and the metal layer 326 in the present embodiment. The P type work function metal layer 318 can serve both the functions of the P type work function metal layer and the barrier layer. As a result, the stack number of the metal layers in the first type conductive type transistor 402 and the second type conductive transistor 502 can be reduced and the problem of poor metal gap filling capability can be overcome.

Similarly, after forming the first metal gate 418 and the second metal gate 518, a contact plug or a CESL having appropriate stress can be formed according to the selective stress system. Besides the high-k first process described above, it is also available to provide a high-k last process in the present embodiment.

In another embodiment of the present invention, a passivating process can be carried out immediately after forming the N type work function metal layer 322 to produce a passivation structure on the surface of the N type work function metal layer 322. For example, the passivating process can be performed by utilizing ammonia ($NH_4OH$), or a nitridation process or an oxidation process to passivate the surface of the N type work function metal layer 322. After the passivating process, the P type work function metal layer 318 or the metal layer 326 can be formed on the N type work function metal layer 322 as described in the above embodiments.

In summary, the present invention provides a method of manufacturing semiconductor device having metal gates. The method includes forming the P type work function metal layer or the N type work function metal layer respectively in the first trench or the second trench, which is then filled with the metal layer. Thus, the present invention can prevent the bad metal layer (usually Al) filling issue. Moreover, only one CMP process is needed in the present invention, so the yield of the method can be improved. Besides, considering the spiking issue of the N type work function metal layer, the present invention also provides several embodiments, including forming a barrier layer, performing a passivating process, or directly using the P type work function metal layer as the barrier layer to ameliorate the method. Furthermore, the present invention also provides using a trimmed process and an annealing process when forming the first trench and the second trench, all of which can increase the reliability of the product.

Those skilled in the art will readily observe that numerous modifications and alterations of the device and method may be made while retaining the teachings of the invention.

What is claimed is:

1. A method of manufacturing a semiconductor device having metal gates, comprising:

providing a substrate, wherein a first conductive type transistor and a second conductive type transistor are disposed on the substrate, and the first conductive type transistor comprises a first sacrifice gate and the second conductive type transistor comprises a second sacrifice gate;

removing the first sacrifice gate of the first conductive type transistor to form a first trench;

forming a first metal layer lining a sidewall and a bottom of the first trench without filling up the first trench;

removing the second sacrifice gate of the second conductive type transistor to form a second trench;

forming a second metal layer in the first trench and the second trench; and forming a third metal layer on the second metal layer wherein the third metal layer completely fills the first trench and the second trench.

2. The method of manufacturing a semiconductor device having metal gates according to claim 1, after forming the third metal layer, further comprising:
performing a planarization process to simultaneously remove the first metal layer, the second metal layer and the third metal layer outside the first trench and the second trench.

3. The method of manufacturing a semiconductor device having metal gates according to claim 1, wherein the first type conductive transistor comprises a P type transistor and the second type conductive transistor comprises an N type transistor.

4. The method of manufacturing a semiconductor device having metal gates according to claim 3, wherein the first metal layer comprises Ni, Pd, Pt, Be, Ir, Te, Re, Ru, Rh, W, Mo, WN, RuN, MoN, TiN, TaN, WC, TaC, TiC, TiAlN or TaAlN.

5. The method of manufacturing a semiconductor device having metal gates according to claim 3, wherein the second metal layer comprises TiAl, ZrAl, WAl, TaAl or HfAl.

6. The method of manufacturing a semiconductor device having metal gates according to claim 3, before forming the third metal layer, further comprising forming a barrier layer on the second metal layer, wherein the barrier layer is filled into the first trench and the second trench.

7. The method of manufacturing a semiconductor device having metal gates according to claim 6, wherein the barrier layer comprises TiN.

8. The method of manufacturing a semiconductor device having metal gates according to claim 3, before forming the third metal layer, further comprising performing a passivating process on the second metal layer.

9. The method of manufacturing a semiconductor device having metal gates according to claim 8, wherein the passivating process comprises an oxidation process, a nitridation process or a process utilizing ammonia.

10. The method of manufacturing a semiconductor device having metal gates according to claim 1, wherein the first type conductive transistor comprises an N type transistor and the second type conductive transistor comprises a P type transistor.

11. The method of manufacturing a semiconductor device having metal gates according to claim 10, wherein the first metal layer comprises TiAl, ZrAl, WAl, TaAl or HfAl.

12. The method of manufacturing a semiconductor device having metal gates according to claim 10, wherein the second metal layer comprises Ni, Pd, Pt, Be, Ir, Te, Re, Ru, Rh, W, Mo, WN, RuN, MoN, TiN, TaN, WC, TaC, TiC, TiAlN or TaAlN.

13. The method of manufacturing a semiconductor device having metal gates according to claim 10, before forming the third metal layer, further comprising performing a passivating process on the second metal layer.

14. The method of manufacturing a semiconductor device having metal gates according to claim 13, wherein the passivating process comprises an oxidation process, a nitridation process or a process utilizing ammonia.

15. The method of manufacturing a semiconductor device having metal gates according to claim 1, wherein the third metal layer comprises Al, Ti, Ta, W, Nb, Mo, TiN, TiC, TaN, Ti/W or Ti/TiN.

16. The method of manufacturing a semiconductor device having metal gates according to claim 1, wherein the step of removing the first sacrifice gate of the first conductive type transistor comprises:
forming a mask layer;
forming a first patterned photoresist layer to cover the second conductive type transistor;
performing a trimmed process toward the first patterned photoresist layer to form a second patterned photoresist layer, wherein the area of the second patterned photoresist layer is less than that of the first patterned photoresist layer;
removing the portions of the mask layer and the first sacrifice gate not covered by the second patterned photoresist layer;
removing the second patterned photoresist layer; and
performing a wet etching process to completely remove the first sacrifice gate.

17. The method of manufacturing a semiconductor device having metal gates according to claim 16, wherein the trimmed process uses a plasma gas comprising $O_2$, $O_3$, $CF_4$ or HBr.

18. The method of manufacturing a semiconductor device having metal gates according to claim 16, further comprising forming an auxiliary layer on the mask layer, wherein the auxiliary layer comprises $SiO_2$.

19. The method of manufacturing a semiconductor device having metal gates according to claim 1, after removing the first sacrifice gate, further comprising performing an annealing process.

20. The method of manufacturing a semiconductor device having metal gates according to claim 1, after removing the second sacrifice gate, further comprising performing an annealing process.

* * * * *